United States Patent [19]

Eisenmann et al.

[11] Patent Number: 5,373,893
[45] Date of Patent: Dec. 20, 1994

[54] METHOD AND APPARATUS FOR COOLING THERMALLY MASSIVE PARTS IN A CONTINUOUS FURNACE

[75] Inventors: David E. Eisenmann, Wappingers Falls; Peter M. Elenius, Hopewell Junction, both of N.Y.; James M. Leas, Burlington, Vt.; Wagih M. Wazni, Poughkeepsie, N.Y.

[73] Assignee: International Business Machines Corporation, Armonk, N.Y.

[21] Appl. No.: 963,500

[22] Filed: Oct. 19, 1992

[51] Int. Cl.[5] .............................................. F25D 13/06
[52] U.S. Cl. .......................................... 165/65; 62/64; 62/380; 62/63
[58] Field of Search .................. 62/63, 64, 380, 257.2, 62/378, 266, 322; 165/65

[56] References Cited

U.S. PATENT DOCUMENTS

| | | | |
|---|---|---|---|
| 1,994,184 | 3/1935 | Williams | 165/65 |
| 3,068,586 | 12/1962 | Vaughan et al. | 62/63 |
| 3,214,928 | 11/1965 | Oberdorfer | 62/63 |
| 3,255,599 | 6/1966 | Morrison | 62/63 |
| 3,267,585 | 8/1966 | Futer | 62/63 |
| 4,237,695 | 12/1980 | Oberprilles et al. | 62/63 |
| 4,422,302 | 12/1983 | Davis et al. | 62/57 |
| 4,715,188 | 12/1987 | Enkegaard | 62/63 |
| 4,923,396 | 5/1990 | Harada et al. | 432/59 |

OTHER PUBLICATIONS

IBM-TDB Article "IR/N$_2$ Heated Isothermal and Movable Light Mass Oven" Kostenko, et al vol. 27 No. 7A Dec. 1984.

*Primary Examiner*—Henry A. Bennet
*Assistant Examiner*—William C. Doerrler
*Attorney, Agent, or Firm*—Mark Wurm; William P. Skladony

[57] ABSTRACT

A method and apparatus for cooling thermally massive parts includes directing a chilled gas onto an electrical component travelling on the belt of a continuous furnace. The belt is divided into a series of hot and cold zones to provide thermal stressing to the electrical component to detect early life failure. As the component cools, a constant thermal stress is maintained by either lowering the temperature or increasing the flow rate of the chilled gas.

31 Claims, 9 Drawing Sheets

PROCESS STEPS

| COMPONENT LOADED ON CONTINUOUS FURNACE BELT AT ENTRANCE TO FURNACE. 101 |

| COMPONENT ENTERS HOT ZONES OF FURNACE. 103 |

| COMPONENT RAMPS UP IN TEMPERATURE. 105 |

| COMPONENT LEAVES HOT ZONES OF FURNACE. 107 |

| COMPONENT RAMPS DOWN IN TEMPERATURE ACCORDING TO FOLLOWING STEPS: |

| COMPONENT ENTERS A COOLING ZONE OF FURNACE. 109 |

| COMPONENT FULLY ENTERS RANGE OF A COOLING GAS JET. 111 |

| COOLING GAS DIRECTED AT ENTIRE COMPONENT. 113 |

| TEMPERATURE OF GAS LOWERED IN STEP WITH COOLING OF COMPONENT. 115 |

| COOLING GAS JET IS TURNED OFF. 117 |

| COMPONENT LEAVES COOLING ZONE. 119 |

| COMPONENT LEAVES FURNACE. 121 |

| COMPONENT UNLOADED FROM BELT. 123 |

FIG. 9a

METHOD AND APPARATUS FOR COOLING THERMALLY MASSIVE PARTS IN A CONTINUOUS FURNACE

BACKGROUND OF THE INVENTION

This invention generally relates to thermal stressing of electrical components. More particularly, it relates to an apparatus and method for thermally stressing by rapidly cooling of electrical components of high thermal mass emerging from the hot zones of a continuous furnace, or belt furnace.

Currently, a sample of components from selected lots is generally sacrificed for thermal stress tests, and if the sample passes, the associated lots are candidates for shipment to customers. Normal production electronic components are not thermally stressed. However, reliability requirements are increasing and there is interest in providing thermal stress to normal production electronic components to remove those with a thermally sensitive class of manufacturing defects.

To find manufacturing defects which would lead to early life fails, high thermal mass semiconductor modules are provided a rapid thermal stress, by first rapid heating and then rapid cooling. Parts are conventionally thermally stressed by methods including rapid immersion in high and low temperature fluids and batch ovens.

The batch ovens are useful for evaluating resistance to thermal stress because they provide excellent temperature and ambient gas control, uniform heating of the entire component and the capability for automatic, repeated heating and cooling cycles covering a wide range from several hundred degrees to liquid nitrogen temperature. However, batch ovens do require a significant stabilization period after oven load to provide all of these characteristics.

Heating coils are used in a batch oven to rapidly raise the temperature. To rapidly lower the temperature, cold nitrogen is directed to flow through the oven. Available batch ovens have important advantages for providing thermal stress: they provide excellent temperature and ambient gas control (after a stabilization period when the oven is loaded), uniform heating and cooling of the entire component, and the capability for heating and cooling cycles covering a wide range from several hundred degrees to the temperature of liquid nitrogen or liquid helium. The ovens can be programmed to repeat the upward and downward thermal cycles hundreds of times.

Continuous furnaces are currently used in processing electronic components for such steps as depositing films, sintering contacts and heating to reflow solder for packaging semiconductor chips. In these processes an important goal is to avoid thermally stressing the components so modest rates of change of temperature are used.

In so far as the Applicants are aware, the prior art has failed to suggest the use of a continuous, belt driven furnace for the stressing complex electronic parts. This is due in part to the capabilities of batch ovens.

Batch ovens are typically of small size, relatively low cost and have higher thermal and gas efficiency when compared to continuous furnaces. In comparing the throughput of batch and continuous flow furnaces, considerations including the size and shape of the components and the time for the thermal process determine the relative advantage. For example, semiconductor wafers and modules can be arranged in a horizontal or vertical stack in a batch oven, each taking up a small volume within the oven; in a continuous furnace an equal number of wafers or modules must be spread flat on the belt, taking up a large furnace area. Thus, batch ovens can exceed the throughput of larger continuous furnaces, giving batch ovens significant floor space, capital, and process cost advantages for low thermal mass components.

Further, there are several problems which are encountered with continuous furnaces, the main disadvantage of standard continuous furnaces for thermal stressing electronic components is that continuous furnaces can provide only a small number of heating and cooling cycles, most preferably one cycle. For more than one cycle, a sequence of furnaces or means to repeatedly bring the components back to the beginning of the furnace must be implemented. These substantially increase capital costs and floor space or degrade throughput. There are several additional problems that must be overcome to thermally stress electronic components in a continuous furnace:

1. The temperature a thermally massive component experiences depends on what precedes and follows it on the belt.

2. To rapidly heat and cool components, the belt must move them through the furnace fast; the demands on the furnace to provide heat to the component or sink heat from the component increase with the rate of temperature change required and thermal mass of the components.

3. Industry and military thermal stress standards call for thermal stresses to be experienced by the component as a whole. There is usually no requirement for the part to withstand large thermal gradients from front to back. In continuous furnaces, components experience these unwanted thermal gradients across their length as they move from one temperature zone to another. The front edge of the component may begin cooling while the back edge is still in a hot zone. If this kind of bulk stress is unlikely to be experienced during the normal life of a component the stress might make components fail that do not have substantial manufacturing defects, unnecessarily reducing yield and adding cost. This problem is accentuated for high thermal mass components because the furnace needs to transfer heat at a faster rate.

4. Means for rapid and controlled heating are available, but means for equally rapid and controlled cooling to low temperature have been unavailable in continuous furnaces.

Because of the advantages of batch ovens and the disadvantages of continuous furnaces, the prior art did not anticipate the use of continuous furnaces for thermally stressing electronic components. Continuous furnaces do have the advantages of a constant product flow, low operator interface and individual processing of each component with no process wait time. For these reasons a continuous furnace for thermal stressing of large components is desirable.

SUMMARY OF THE INVENTION

It is therefore an object of the present invention to rapidly cool high thermal mass electrical modules in a continuous furnace.

It is another object of the invention to provide high intensity localized thermal stress to high thermal mass electrical modules in a continuous furnace.

It is another object of the invention to maintain high intensity localized thermal stress on a high thermal mass electrical component for an extended period of time.

It is another object of the invention to uniformly thermally stress the entire module, avoiding unwanted thermal stress between front and back of the modules as they move through large thermal gradients in the cooling zones of the furnace.

These and other objects of the invention are accomplished by directing a chilled inert gas, such as nitrogen, helium, hydrogen, carbon dioxide, or argon, of controlled temperature and flow rate, toward the components to be stressed. The gas is directed at the components for a period of time beginning and ending while the entire component is located under the chilled gas nozzle to receive the flow of gas.

In one embodiment, valves control the flow of gas to an array of nozzles. When the component located on the belt moves to a position so that it is fully within the array of nozzles, the gas flow is initiated. Before the front edge of the component moves out of a position within the array of nozzles, the gas flow is stopped. Thus, no temperature gradient across the component is created during the cooling. In other embodiments, multiple arrays or cooling zones are possible.

In another embodiment, the same effect is created by using a single nozzle or an array of nozzles moving with the component to provide thermal stress uniformly across its length.

The component cools as heat flows from the component to the gas. The amount of heat flowing from a component is proportional to two factors; (1) the flow rate of the gas and (2) the temperature difference between the gas and component. If the temperature of the gas is held constant as the temperature of a component declines, the component's cooling rate also declines because the difference in temperature between the component and the gas decreases. If the temperature of the gas is well below that of the component, then the cooling rate may be satisfactory. As the component temperature approaches the temperature of the gas the more the cooling rate declines. This invention provides for significantly faster and more linear cooling by compensating for the cooling of the component with continuously lower temperature gas in step with the cooling of the component. The compensation can also be achieved by continuously increasing the flow rate of the gas or by combining increasing gas flow with declining gas temperature.

The gas temperature is ramped by mixing decreasing amounts of room temperature nitrogen with increasing amounts of cold nitrogen emerging from the gas phase of a liquid nitrogen dewar. Programmable mass flow controllers are among available equipment that can be used to mix the gases to obtain a linear reduction in gas temperature with constant total flow rate. By maintaining a roughly constant temperature difference between component and gas, the component declines in temperature at a constant rate. Depending on the starting temperature of the cooling cycle, the thermal stress on the component can be controlled. It can be less, equal or greater than the stress achieved with a constant temperature and flow rate system.

BRIEF DESCRIPTION OF THE DRAWINGS

The accompanying drawings illustrate one embodiment of the invention and together with the description serve to explain the principles of the invention.

DETAILED DESCRIPTION OF THE DRAWINGS

Figure 1:
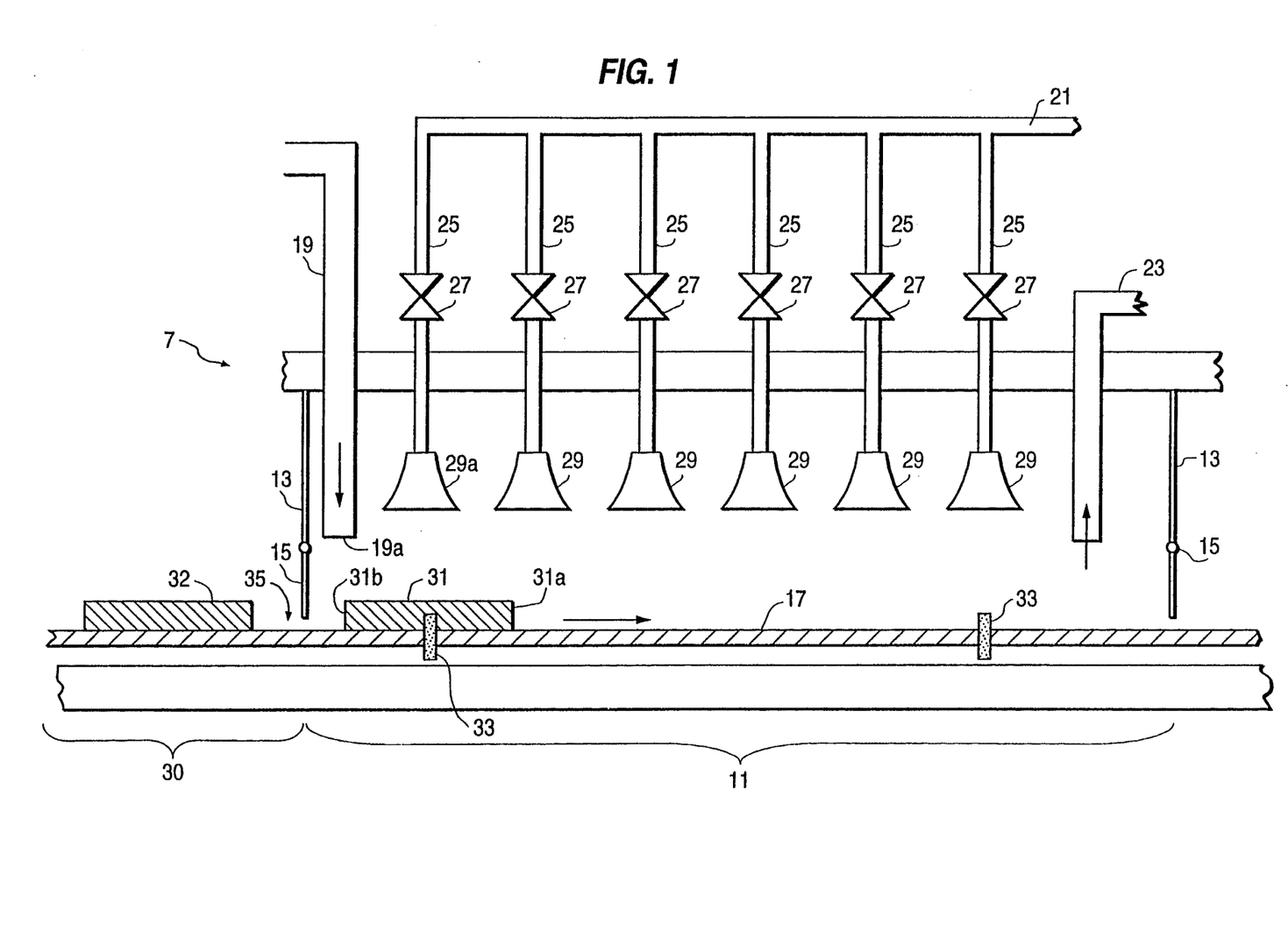
FIG. 1 is a cross-sectional view of a continuous furnace showing a high thermal mass electronic component about to enter into a zone with an array of cooling jets.

Referring to FIG. 1, the furnace 7 contains a cooling 11. The cooling zone 11 is isolated from the heating zone 30 by fixed insulated baffles 13 and a swinging gate insulated baffles 15. Similar baffles are located at the exit from the cooling zone. Component 31 is carried through the furnace on a belt 17.

Figure 2:
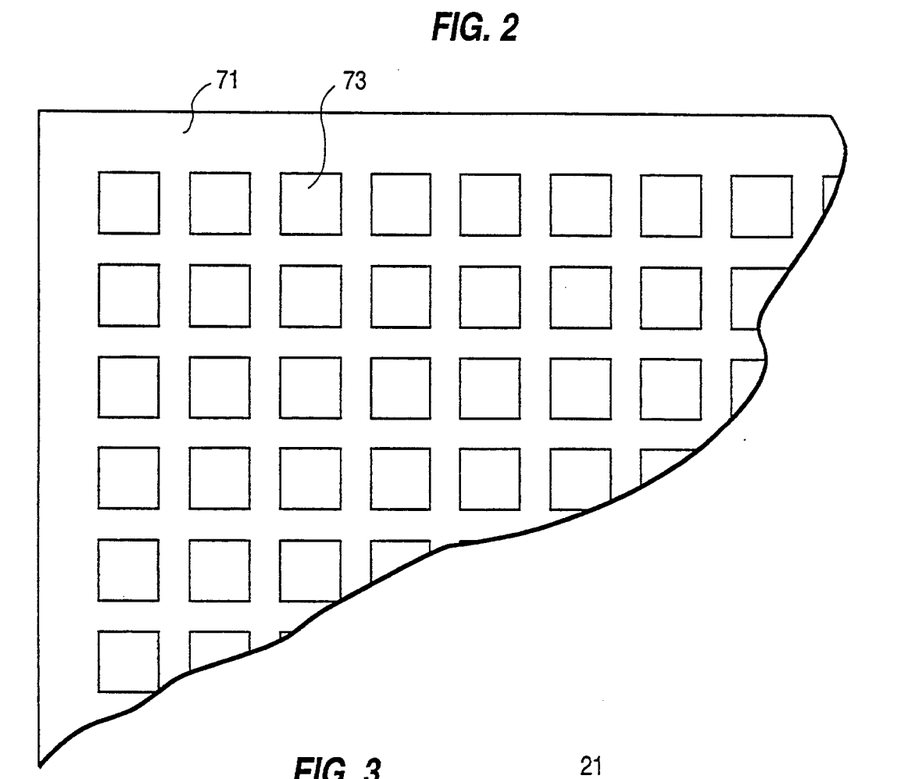
FIG. 2 is a partial top view of an electronic package with chips.

FIG. 2 is a planar section of an electronic substrate 71 with chips 73. A cover (not shown) with a heat sink (not shown) is also included and adds significantly to the thermal mass of the package. The cover and heat sink are made from materials including alumina, aluminum, copper, invar, and stainless steel. The substrate 71 is formed from materials including alumina, glass ceramic, and silicon. Typical packages contain 10 or more chips and have high thermal mass.

Referring again to FIG. 1, a nitrogen or forming gas blanket 19A provided by a nozzle 19 near the entrance to the cooling zone impedes the inflow of heated air from the preceding hot zone 30 and an exhaust 23 near the exit of the cooling zone 11 helps isolate this zone from the end of the furnace or its next cooling or heating zone.

Cooling gas is introduced into the cooling zone 11 through trunk gas line 21 and individual gas lines 25 at a temperature in the range from $-273°$ C. to $25°$ C. Most typically, the temperature will be in the $-196°$ C. to $25°$ C. range. The gas lines 25 are interrupted by control valves 27. Exhaust ducts 23 (not shown in detail) vent the cooling zone 11.

Without valves 27 the gases would always be flowing. The leading edge 31A of component 31 entering the cooling zone would start rapid cooling before the trailing edge 31B enters the zone, so a thermal gradient would appear across the component adding an unwanted thermal stress, avoided in standard batch ovens. The large thermal gradient within the component could cause good parts to fail.

A shown in FIG. 1, the thermal gradient problem is overcome by controlling the flow of gas by means of valves 27. The valves 27 are closed and gas flow is not initiated until the full length of the component 31 has sufficiently penetrated the cooling zone 11 to receive gas flow uniformly. An optical or magnetic sensor 33 activated by the swinging baffle 15 located at the entrance of the cooling zone 11 senses the leading 31A edge of the component 31 and after a suitable delay, turns on the valves 27. The valves are turned off after a further delay to avoid thermal gradients as the component 31 exits. The delays are determined by the speed of the belt and the distance the component needs to travel. The timings are controlled by standard methods known in the art.

A single valve in the trunk gas line 21 feeding individual gas lines 25 could provide means to avoid the unwanted thermal stress within the component, as well as the array of valves 27, one for each individual line 25. However, by providing a valve 27 for each line 25 it is possible to more closely space components on the belt and conserve gas by turning off the flow to nozzles when no component is in a position to receive the gas flow or between components. Exhaust nozzles 23 (not shown in detail) are best located across from the supply nozzles to avoid imbalanced flow. Optical and magnetically operated sensors control the valves or start a programmed sequence of valve openings and closings.

A space 35 between components is necessary so that the nozzle 29A near the entrance to the cooling zone 11 can be turned off after a component 31 has substantially left its flow region and before the next component 32 begins to enter its flow region. With control over at least the first valve in the array 29A, the space between components can be reduced to approximately the flow region of nozzle 29A.

Figure 3:
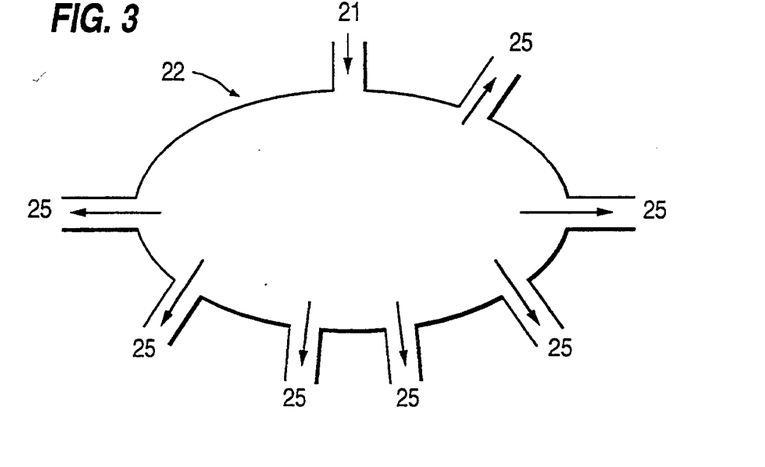
FIG. 3 is an illustration of star coupling used in the gas feed and exhaust lines providing gas at uniform temperature and flow rate to all the nozzles in an array of nozzles from a single feed source.

The star coupling 22 shown in FIG. 3 provides an alternate means of directing the gas into a set of individual lines 25. The lines 25 are all of equal length so that the gas streams emerging from the nozzles 29 are all of nearly identical temperature and flow rate.

A star coupling similar to that in FIG. 3 is also used to combine exhaust ducts 23 needed to vent the cooling zone 11. The exhaust lines can be located within the frame of the furnace below the belt. Belt 17 may be perforated to permit gas flow through it. Balanced exhaust further helps maintain flow uniformity through the nozzles 29.

Figure 4:
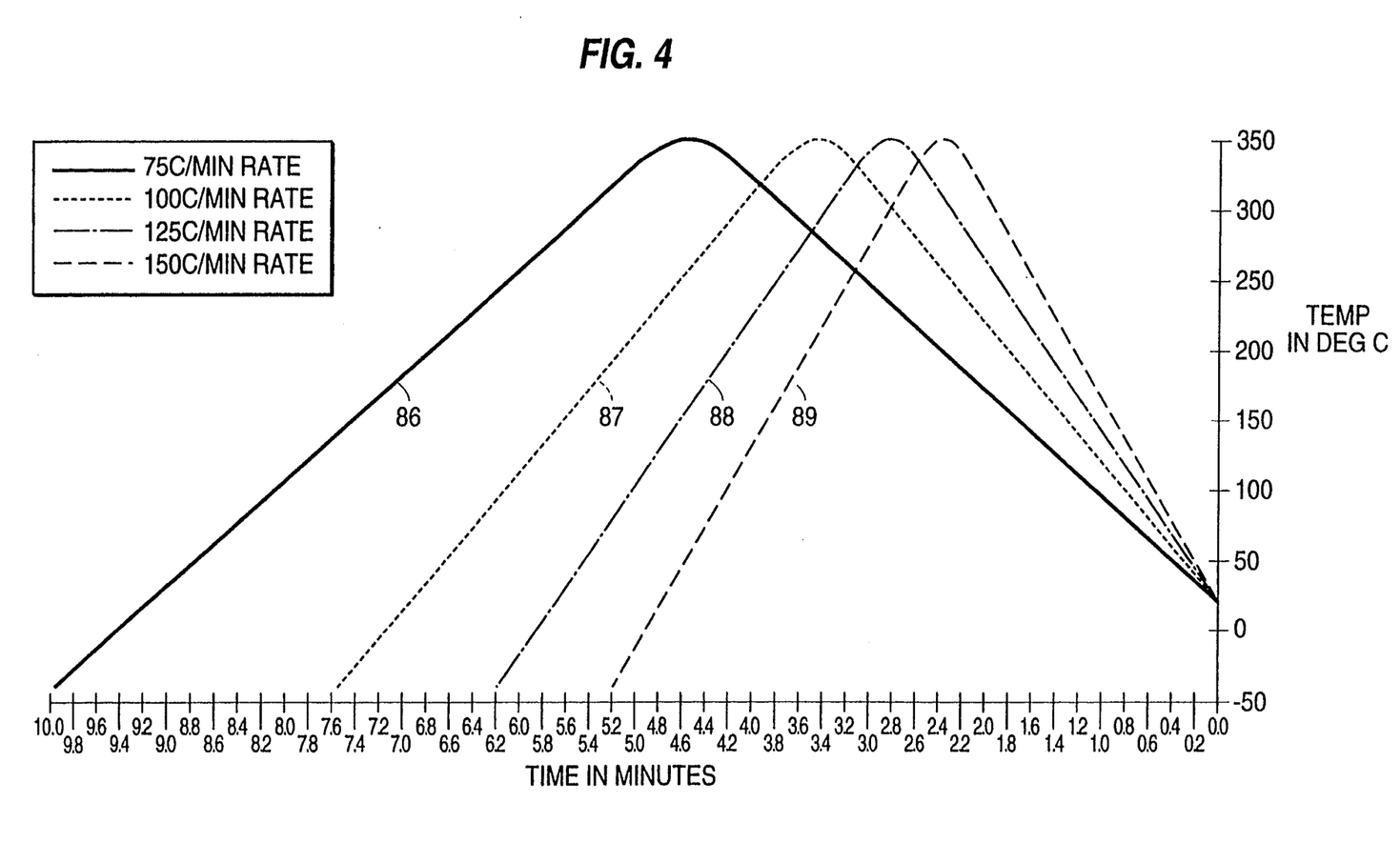
FIG. 4 shows four temperature curve profiles for thermal stressing.

The graph in FIG. 4 illustrates several desired temperature curves for thermal stressing, each with a linear temperature ramp-up rate equal in magnitude to the ramp-down rate. The rates of change of temperature are 75° C./minute 86, 100° C./minute 87, 125° C./minute 88, and 150° C./minute 89. In these examples the temperature varies from −50° C. to 350° C.

Figure 5:
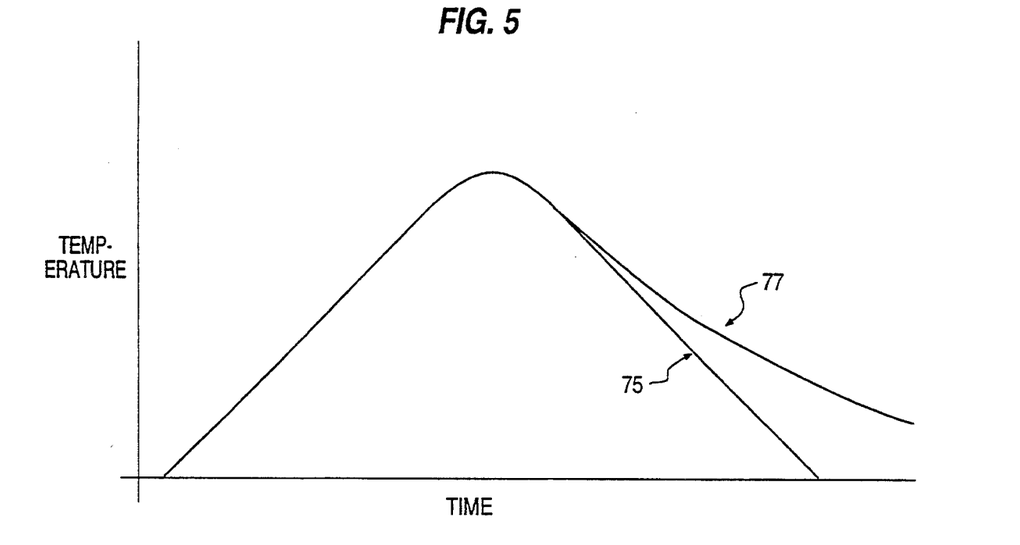
FIG. 5 shows both the thermal cooling stress achieved with constant temperature gas flowing on the component and the thermal stress with a steadily decreasing temperature gas flowing on the component.

As shown by graph 77 in FIG. 5, if the temperature and flow rate of gas directed at the component 31 are held fixed, then the component 31 will experience its greatest cooling rate near the entrance to the zone when the difference in temperature between the component and the gas is greatest. After that the component's cooling rate declines.

To maintain the component 31 under the maximum thermal stress for a greater time, it is desirable to avoid the fall off in cooling rate. A constant rate of cooling is accomplished in the invention by adjusting the gas parameters in step with the cooling of the component 31: the gas flow rate is increased or the gas temperature is lowered.

In the first case, steadily increasing the flow rate of the gas permits constant stress without changing the temperature of the gas. In the second case, steadily lowering the temperature of the gas permits constant stress without increasing the overall flow. Graph 75 in FIG. 5 shows the component cooling at a constant rate by maintaining a constant temperature difference between component and gas. Clearly, it is also possible to achieve a desired cooling curve with a combination of lowering temperature and increasing flow rate.

The temperature of the gas is controllably lowered by mixing gas at two distinct but precisely known temperatures, for example, gas at liquid nitrogen temperature and gas at room temperature. A linear rate of change of temperature of the mixture with time is achieved by steadily decreasing the mass flow rate of room temperature gas while in the same proportion increasing that of liquid nitrogen temperature gas. Since the flow of each gas is independently controlled, the changes in their flow, the flow of the mixture, and the corresponding temperature of the mixture can therefore also follow any other desired pattern.

The gas entering through line 21 of FIG. 1 is chilled below room temperature by combining nitrogen gas from a liquid nitrogen dewar with house nitrogen gas at room temperature. Mixing is best accomplished by directing the two gases at equal pressure into the line feeding the valves 27. By controlling the proportion from each source, gas at any temperature between the two source temperatures can be directed onto the component 31. The proportion from each source is best controlled with mass flow controllers in each of the two lines.

Figure 6:
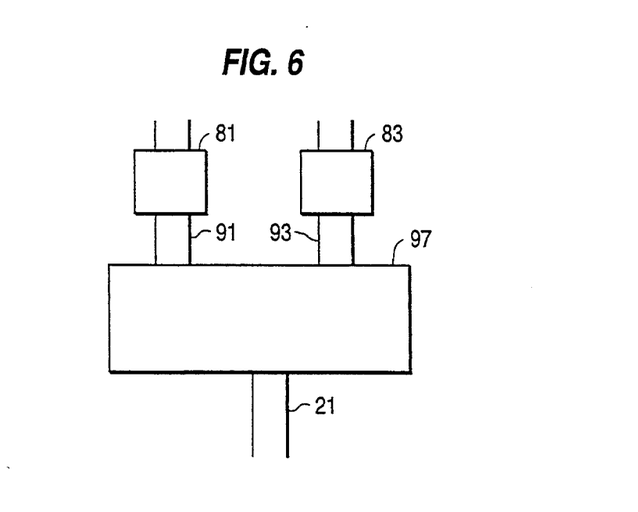
FIG. 6 illustrates the use of mass flow controllers in the line of flow of a gas to provide controlled mixing of gases at different temperatures.

Mass flow controllers 81 and 83 are schematically illustrated in FIG. 6 and are well known means to establish and programmably change the flow rate of a gas. If the temperatures of the two gases are well established, then the temperature of the mixture formed in chamber 97 depends on the precision of control of the flow of each, and mass flow controllers 81 and 83 provide precise flow control. Lines 91 and 93 connect the mass flow controllers to chamber 97. Mass flow controllers can also be integrated with feedback from a temperature sensor if alternate means for temperature control are desired.

Figure 7A:
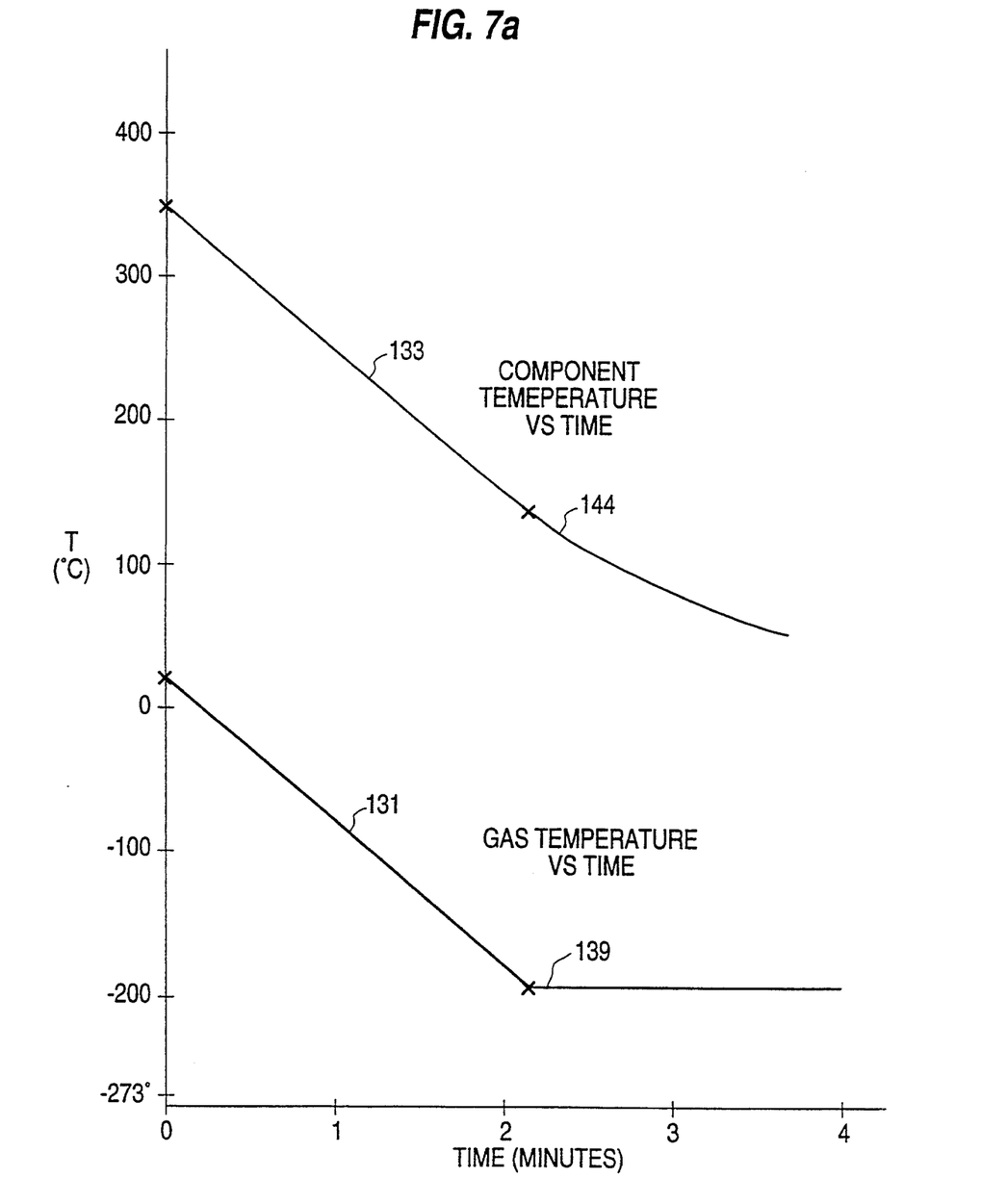
FIG. 7A graphically shows how the temperature of gas changes with time to maintain constant stress on the component.
Figure 7B:
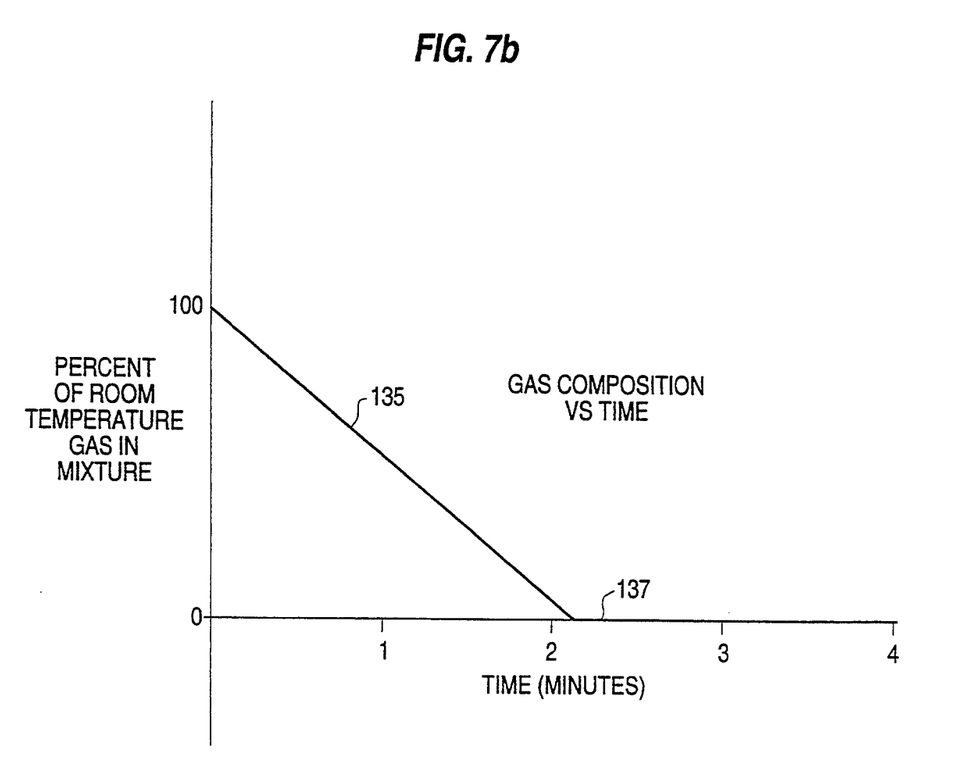
FIG. 7B graphically shows how the composition of the gas mixture changes with time by changing the proportion of two constant temperature supply gases, one at a very cold temperature, the other at room temperature.

FIG. 7A graphically illustrates the temperature change of the gas 131 and the component 133 in accord with the present invention. FIG. 7B illustrates the change over time in the mixture of two source gases, one at a very cold temperature, the other at room temperature 135 to achieve the temperature change shown in FIG. 7A. While it is also possible to vary the flow rate, in this example, the total flow of gas is held fixed; only the proportion of the two gases is changed. In this example, the cold temperature gas is at −196° C., the temperature of liquid nitrogen, the room temperature gas is at 20° C. With both gases at the same pressure, the mass flow rate of the room temperature gas is decreased and the mass flow rate of the cold temperature gas increased so that the temperature of the mixture declines 131 linearly with time at the cooling rate desired.

Once the mixture is 100% formed from the cold temperature gas its composition stops changing 137. Therefore, the linear cooling of the gas mixture proceeds until the mixture is 100% composed of the cold temperature gas. The mixture cannot get colder and remains at that temperature 139.

Also in FIG. 7A the cooling of the component is illustrated 133 shows the component cooling while it is exposed to a flow of gas whose temperature is changing in step with the cooling of the component. Once the minimum gas temperature is reached 139, the cooling rate of the component slows 141 and the thermal stress on the component decreases as well, 133 shows the constant thermal stress and 141 the decreasing thermal stress portions of the cooling.

Figure 8:
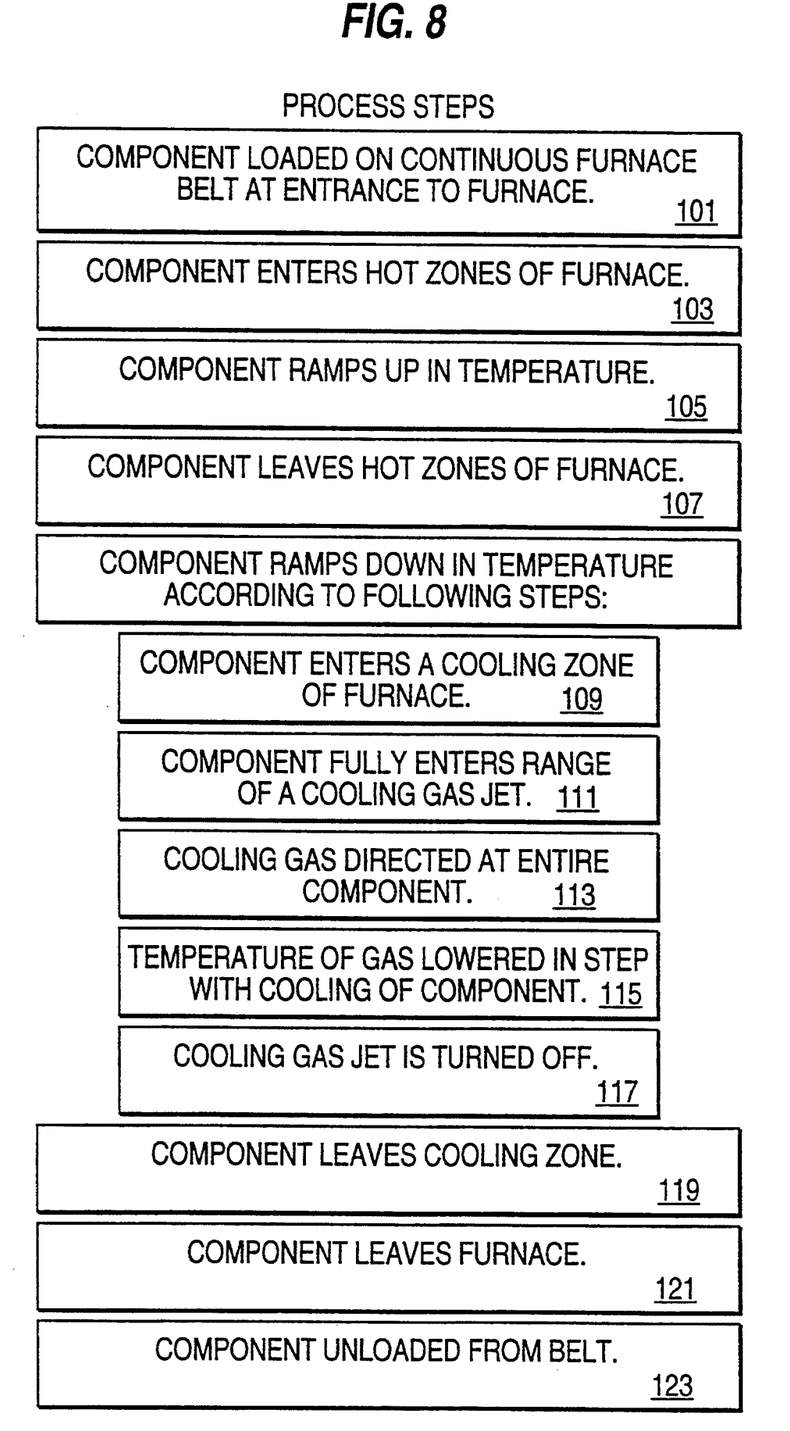
FIG. 8 is a flow diagram illustrating the process steps.

Referring to FIG. 8, presented are the steps for obtaining a constant thermal stress across the component while avoiding stress from front to back of the component. The component is loaded on a continuous furnace belt at the entrance to the furnace 101. The component enters the hot zones of the furnace 103 and ramps up in temperature 105. The component then leaves the hot zones of the furnace 107 and enters a cooling zone of the furnace 109. The temperature ramp down is achieved as the component moves fully into the range of a cooling gas jet 111. Cooling gas is then directed at the entire component 113. The temperature of gas is lowered in step with cooling of the component 115. The cooling gas jet is turned off 117 before the component leaves the range of the jet 119. The component leaves the furnace 121, and then is unloaded from the belt 123.

Figure 9A:
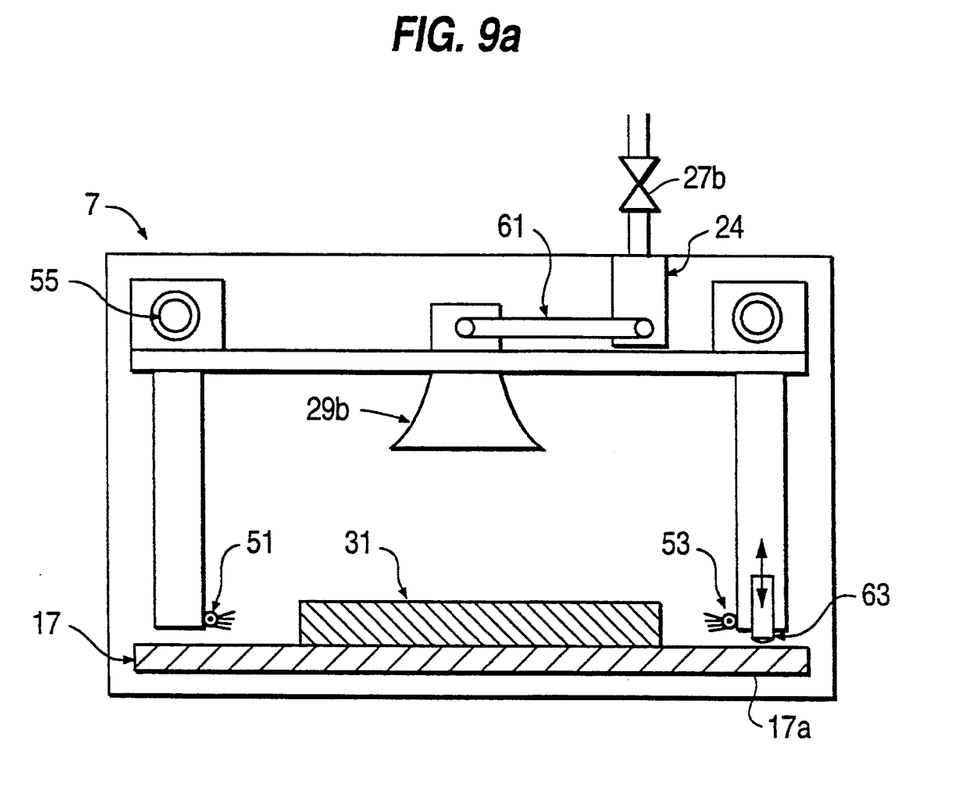
FIG. 9A and 9B are a front view and side view, respectively, of a continuous furnace showing a high thermal mass electronic component located under a cooling jet moving along with the component.
Figure 9B:
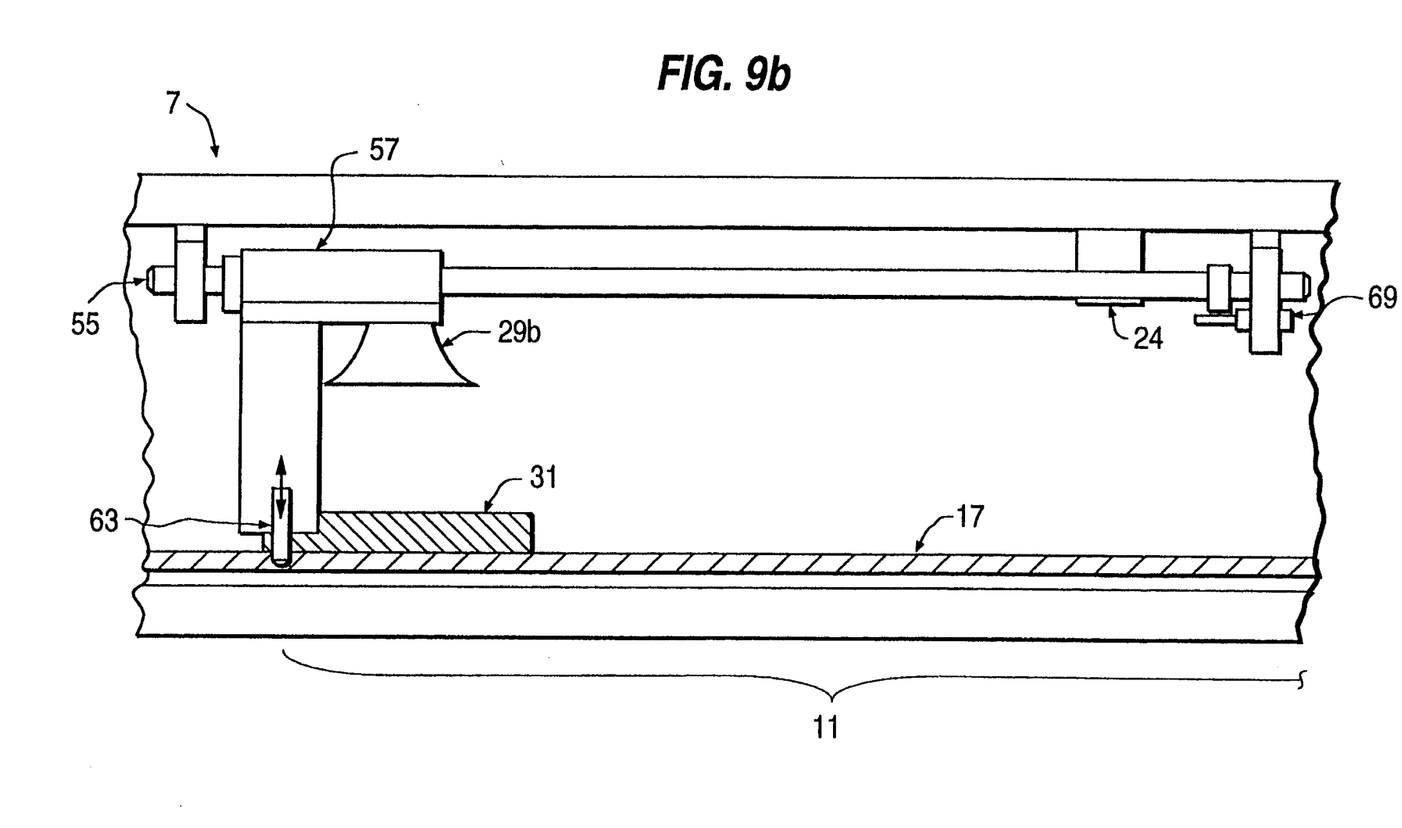

Referring to FIGS. 9A and 9B, an alternate means is shown for avoiding thermal stress between the leading and trailing ends of the component. The belt 17 carries the component through the cooling zone 11 of the furnace 7. A through-beam sensor 51 is broken by component 31. This activates a shot pin 63 extending into the belt 17 and mechanically engaging into a belt link 17A. The sensor also electrically activates the valve 27b initiating gas flow through flexible tube 61 and gas manifold 24 to nozzle assembly 29B.

The nozzle assembly 29B is pulled along with the component 31 because of the shot pin 63 engaged into the belt 17. When the end of bearing shaft 55 is reached, the plunger switch 69 is activated, the shot pin 63 is released, the valve 27B is closed, stopping the flow of gas and the nozzle assembly 29B retracts to its starting position.

While an embodiment of the invention, together with modifications thereof, have been described in detail herein and illustrated in the accompanying drawings, it will be evident that various further modifications are possible without departing from the scope of the invention. Nothing in the above specification is intended to limit the invention more narrowly than the appended claims. The examples given are intended only to be illustrative rather than exclusive.

We claim:

1. An apparatus for thermally stressing a high thermal mass electronic component in a continuous belt furnace by impinging the component with a gas at a temperature lower than the component, comprising:
   a continuous belt furnace;
   a separate cooling zone in the furnace having an inlet and an outlet;
   means for introducing the component into the cooling zone through the inlet, moving the component through the cooling zone, and withdrawing the component from the cooling zone through the outlet;
   sensing means for determining when the component is completely within the cooling zone; and
   a plurality of gas jet nozzles in the cooling zone directing a chilled gas onto the component while the component is completely within the cooling zone.

2. An apparatus as recited in claim 1 which further comprises means to control the flow rate and temperature of gas flowing through the gas jet nozzle.

3. An apparatus as recited in claim 1 wherein the temperature of the gas is in the range $-273°$ to $20°$ C.

4. An apparatus as recited in claim 1 further comprising means to increase the flow rate of the gas during the cooling of the component to maintain the thermal stress on the component.

5. An apparatus as recited in claim 1 further comprising means to lower the temperature of the gas during the cooling of the component to maintain the thermal stress on the component.

6. An apparatus as recited in claim 5 comprising means to maintain a constant difference between the temperature of the component and the temperature of the gas.

7. An apparatus as recited in claim 2 wherein the means to control gas temperature mixes a first and second gas, each at a predetermined fixed temperature.

8. An apparatus as recited in claim 7, wherein the first gas is nitrogen at room temperature, approximately $20°$ C.

9. An apparatus as recited in claim 7, wherein the second gas is nitrogen at a temperature near that of liquid nitrogen, $-196°$ C.

10. An apparatus as recited in claim 7, wherein the mixing ratio changes with time.

11. An apparatus as recited in claim 10, wherein the mass flow of the first gas decreases with time while the mass flow of the second gas increases with time.

12. An apparatus as recited in claim 11, wherein the mass flow of the first gas decreases at the same rate the mass flow of the second gas increases.

13. An apparatus as recited in claim 1, comprising an array of gas jet nozzles.

14. An apparatus as recited in claim 13, wherein the nozzles are fed from a star coupling to improve gas temperature uniformity from nozzle to nozzle.

15. An apparatus as recited in claim 13, wherein the gas lines to the nozzles are of equal length to improve gas temperature uniformity from nozzle to nozzle.

16. An apparatus as recited in claim 1, wherein the gas flow is initiated only when the full length of the component is within the cooling zone and located to receive flow from the gas jet nozzle.

17. An apparatus as recited in claim 13, comprising means to direct gas only to those gas jet nozzles in the array which are located so as to direct gas toward a component, thereby conserving gas.

18. An apparatus as recited in claim 17, wherein said gas directing means is initiated by a sensor detecting the presence of a component.

19. An apparatus as recited in claim 1, further comprising a gas jet nozzle that moves along with the component.

20. An apparatus as recited in claim 1, further comprising a plurality of cooling zones in sequence.

21. A method for thermally stressing components in a continuous belt furnace, the furnace having heating and cooling zones, comprising the steps of:

introducing a component from a heating zone into a first end of a cooling zone of the continuous belt furnace;

sensing the position of the component in relation to the cooling zone;

flowing a cooling gas onto the component after it is fully in the cooling zone;

terminating the flow of cooling gas prior to the component's exit of the cooling zone, and withdrawing the component from a second end of the cooling zone.

22. A method as recited in claim 21, comprising the step of directing gas onto the component from a gas nozzle moving along with the component.

23. A method as recited in claim 21 wherein the chilled gas substantially includes one from the group air, nitrogen, carbon dioxide, argon, hydrogen, and helium.

24. A method as recited in claim 21, further comprising the step of increasing the flow rate of the gas during the cooling of the component.

25. A method as recited in claim 21, further comprising the step of lowering the temperature of the gas during the cooling of the component.

26. A method as recited in claim 25, further comprising the step of maintaining a constant difference between the temperature of the component and the temperature of the gas.

27. A method as recited in claim 25, further comprising the step of mixing a first and second gas, each at a predetermined fixed temperature.

28. A method as recited in claim 27, wherein the first gas is nitrogen at room temperature, approximately 20° C.

29. A method as recited in claim 27, wherein the second gas is nitrogen at a temperature near that of liquid nitrogen, $-196°$ C.

30. A method as recited in claim 27, wherein the mass flow of the first gas is decreased with time while the mass flow of the second gas is increased with time.

31. A method as recited in claim 30, wherein the mass flow of the first gas decreases at the same rate the mass flow of the second gas increases.

* * * * *